US008289747B2

(12) United States Patent
Lee et al.

(10) Patent No.: US 8,289,747 B2
(45) Date of Patent: Oct. 16, 2012

(54) NON-VOLATILE MEMORY DEVICE AND METHOD OF OPERATING THE SAME

(75) Inventors: Myoungjae Lee, Suwon-si (KR); Inkyeong Yoo, Suwon-si (KR); Youngsoo Park, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 205 days.

(21) Appl. No.: 12/385,390

(22) Filed: Apr. 7, 2009

(65) Prior Publication Data

US 2010/0054015 A1  Mar. 4, 2010

(30) Foreign Application Priority Data

Aug. 26, 2008  (KR) .................. 10-2008-0083518

(51) Int. Cl.
*G11C 11/00* (2006.01)
*G11C 11/34* (2006.01)
*G11C 7/00* (2006.01)
(52) U.S. Cl. .................. 365/148; 365/175; 365/189.011
(58) Field of Classification Search .......... None
See application file for complete search history.

(56) References Cited

U.S. PATENT DOCUMENTS

| 7,209,378 | B2 | 4/2007 | Nejad et al. |
| 7,307,268 | B2 * | 12/2007 | Scheuerlein ............ 257/2 |
| 7,554,873 | B2 * | 6/2009 | Lee et al. ............ 365/230.03 |
| 2004/0090815 | A1 * | 5/2004 | Tajiri ............ 365/148 |
| 2006/0233082 | A1 | 10/2006 | Lee et al. |
| 2006/0268594 | A1 * | 11/2006 | Toda ............ 365/100 |
| 2008/0175032 | A1 * | 7/2008 | Tanaka et al. ............ 365/51 |

FOREIGN PATENT DOCUMENTS

JP  2005-311322  11/2005

* cited by examiner

*Primary Examiner* — Hoai V Ho
*Assistant Examiner* — James G Norman
(74) *Attorney, Agent, or Firm* — Harness, Dickey & Pierce, P.L.C.

(57) ABSTRACT

Provided is a non-volatile memory device that may include a plurality of variable resistors, each of the variable resistors having first and second terminals, the plurality of variable resistors arranged as a first layer of a plurality of layers and having data storage capability, at least one common bit plane arranged as a second layer of the plurality of layers and coupled to the first terminal of each of the variable resistors of the first layer, and a plurality of bit lines coupled to the second terminal of each of the variable resistors of the first layer.

20 Claims, 7 Drawing Sheets

NON-VOLATILE MEMORY DEVICE AND METHOD OF OPERATING THE SAME

CROSS-REFERENCE TO RELATED APPLICATIONS

This application claims the benefit of Korean Patent Application No. 10-2008-0083518, filed on Aug. 26, 2008, in the Korean Intellectual Property Office, the disclosure of which is incorporated herein in its entirety by reference.

BACKGROUND

1. Field

Example embodiments relate to a semiconductor device, for example, to a non-volatile memory device and a method of operating the non-volatile memory device.

2. Description of the Related Art

Semiconductor products are becoming smaller in size and requiring a capability to process data in large capacities. Accordingly, the operational speed of a non-volatile memory device used in the semiconductor products needs to be increased as well as a degree of integration of the non-volatile memory device. In this regard, a non-volatile memory device having a multi-layer structure instead of a single-layer structure is being used for products that are highly integrated.

SUMMARY

According to example embodiments, a non-volatile memory device may include a plurality of variable resistors, each of the variable resistors having first and second terminals, the plurality of variable resistors arranged as a first layer of a plurality of layers and having data storage capability, at least one common bit plane arranged as a second layer of the plurality of layers and coupled to the first terminal of each of the variable resistors of the first layer, and a plurality of bit lines coupled to the second terminal of each of the variable resistors of the first layer.

In example embodiments, a plurality of cell selection transistors may be coupled between the plurality of bit lines and the plurality of variable resistors.

In example embodiments, a plurality of word lines may be coupled to the plurality of cell selection transistors to switch the plurality of cell selection transistors between one of an on and off state.

In example embodiments, the plurality of variable resistors may be arranged in a matrix form in the first layer, and the plurality of bit lines may extend across the plurality of word lines to selectively access the plurality of variable resistors in the first layer.

In example embodiments, a plurality of switching devices may be coupled between the plurality of variable resistors and the at least one common bit plane.

In example embodiments, each of the plurality of switching devices may include a diode.

In example embodiments, at least one layer selection line may be coupled to the at least one common bit plane.

In example embodiments, at least one layer selection transistor may be coupled between the at least one common bit plane and the at least one layer selection line.

In example embodiments, a layer selection word line may be coupled to the at least one layer selection transistor to switch the at least one layer selection transistor between one of an on and off state.

In example embodiments, at least one decoder line may be coupled to at least one of the bit lines.

In example embodiments, the plurality of variable resistors may be arranged in more than one of the plurality of layers, and the at least one common bit plane may be arranged in more than one of the plurality of layers as a stacked plurality of common bit planes.

In example embodiments, the second terminals of at least one of the plurality of variable resistors in each of the plurality of layers may be commonly coupled to each other.

According to example embodiments, a method of operating the non-volatile memory device may include selecting at least one common bit plane among a plurality of common bit planes, selecting at least one bit line among a plurality of bit lines, and selecting at least one word line among a plurality of word lines coupled to a plurality of cell selection transistors between the plurality of bit lines and a plurality of variable resistors.

In example embodiments, the method may further include recording data to at least one of the plurality of variable resistors.

In example embodiments, the method may further include reading the data from the at least one of the plurality of variable resistors.

According to example embodiments, a non-volatile memory device may include at least one common bit plane arranged as one of a plurality of layers, a plurality of variable resistors coupled to the at least one common bit plane as at least another of the plurality of layers and having data storage capability, a plurality of through electrodes extending through the at least one common bit plane and coupled to at least one of the plurality of variable resistors, and a plurality of bit lines coupled to the plurality of through electrodes.

In example embodiments, a plurality of switching devices may be interposed between the plurality of variable resistors and the at least one common bit plane.

In example embodiments, the plurality of variable resistors may be disposed to surround sidewalls of the plurality of through electrodes, and sidewalls of the plurality of variable resistors may contact the sidewalls of the plurality of the through electrodes.

In example embodiments, a plurality of top electrodes on the plurality of variable resistors may be opposite to the at least one common bit plane, wherein the plurality of top electrodes may contact the plurality of through electrodes.

In example embodiments, a spacer insulating layer may be interposed between the at least one common bit plane and the sidewalls of the plurality of through electrodes.

BRIEF DESCRIPTION OF THE DRAWINGS

The above and other features and advantages will become more apparent by describing in detail example embodiments thereof with reference to the attached drawings in which.

DETAILED DESCRIPTION

Reference will now be made in detail to example embodiments, which are illustrated in the accompanying drawings, wherein like reference numerals refer to the like elements throughout. In this regard, example embodiments may have different forms and should not be construed as being limited to the descriptions set forth herein. Accordingly, example embodiments are merely described below, by referring to the figures, to explain aspects of the present description. In the drawings, the thicknesses of layers and regions may be exaggerated for clarity.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of example embodiments.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures. The figures are intended to depict example embodiments and should not be interpreted to limit the intended scope of the claims. The accompanying figures are not to be considered as drawn to scale unless explicitly noted.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof. In this specification, the term "and/or" picks out each individual item as well as all combinations of them.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Now, in order to more specifically describe example embodiments, example embodiments will be described in detail with reference to the attached drawings. However, example embodiments are not limited to the embodiments described herein, but may be embodied in various forms. In the figures, if a layer is formed on another layer or a substrate, it means that the layer is directly formed on another layer or a substrate, or that a third layer is interposed there between.

When it is determined that a detailed description related to a related known function or configuration may make the purpose of example embodiments unnecessarily ambiguous, the detailed description thereof will be omitted. Also, terms used herein are defined to appropriately describe example embodiments and thus may be changed depending on a user, the intent of an operator, or a custom. Accordingly, the terms must be defined based on the following overall description within this specification.

Example embodiments will now be described more fully with reference to the accompanying drawings. Example embodiments may, however, be embodied in many different forms and should not be construed as being limited to example embodiments set forth herein. Rather, example embodiments are provided so that this disclosure will be thorough and complete, and will fully convey the concept of example embodiments to those of ordinary skill in the art.

Figure 1:
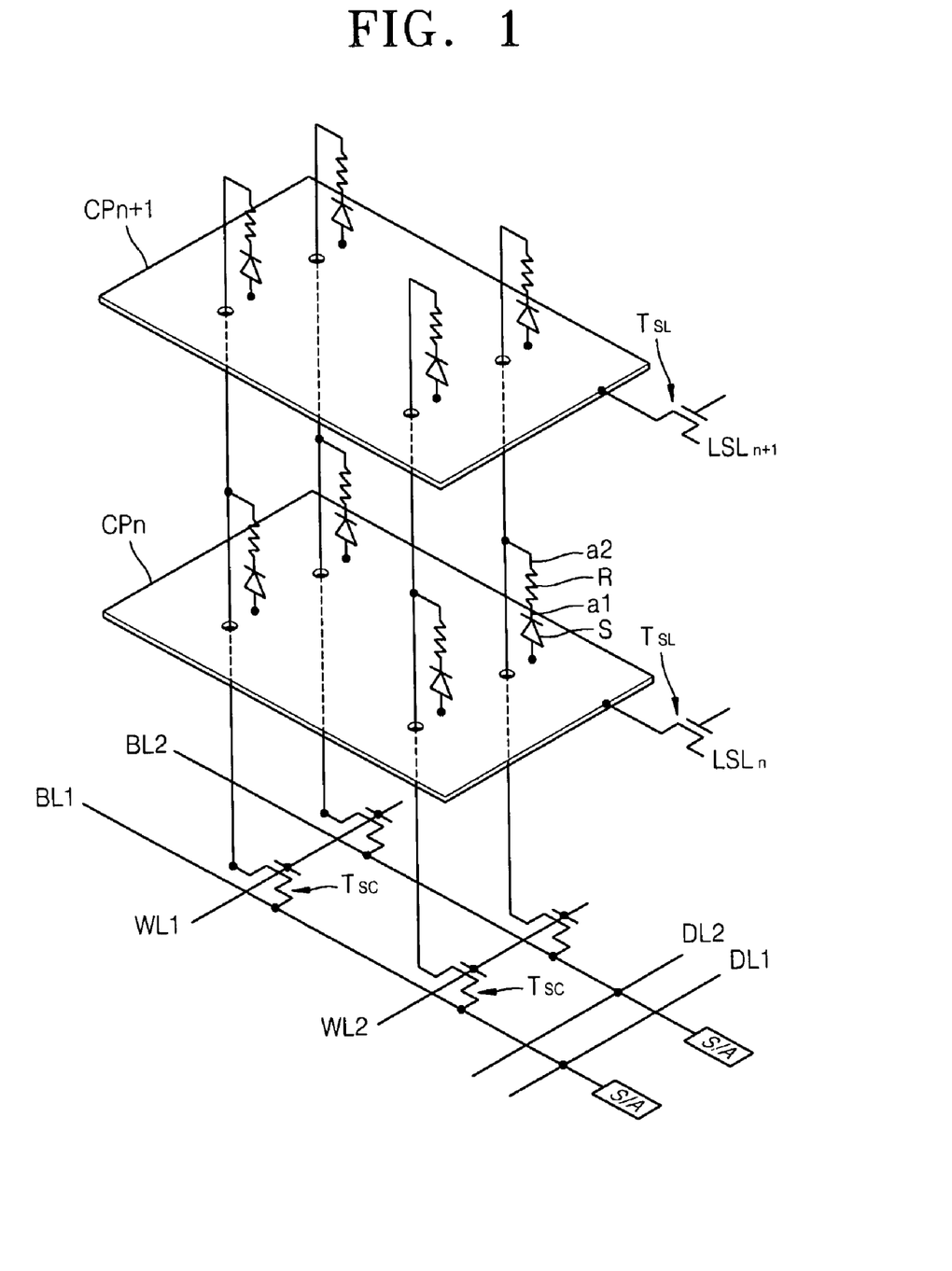
FIG. 1 is a circuit diagram illustrating a non-volatile memory device according to example embodiments.

FIG. 1 is a circuit diagram illustrating a non-volatile memory device according to example embodiments.

Referring to FIG. 1, at least one common bit plane that is arranged as at least one layer, for example, common bit planes CPn and CPn+1 are provided. The common bit planes CPn and CPn+1 may be conductor planes, where n is a natural number denoting the number of layers. In FIG. 1, first through (n−1)th common bit planes CP1 through CPn−1 under the n-th common bit plane CPn are not illustrated for convenience.

At least one layer selection line, for example, layer selection lines LSLn and LSLn+1 may be respectively coupled to the common bit planes CPn and CPn+1. At least one layer selection transistor, for example, layer selection transistors TSL may be coupled between the layer selection lines LSLn and LSLn+1 and the common bit planes CPn and CPn+1, respectively. The layer selection lines LSLn and LSLn+1 may be used to transmit electrical signals selectively to the common bit planes CPn and CPn+1, respectively.

A plurality of variable resistors R may be arranged as at least one layer between the first through (n+1)th common bit planes CP1 and CPn+1. In FIG. 1, the variable resistors R arranged in two layers are illustrated, but example embodiments are not limited thereto. For example, the variable resistors R may be arranged in one layer or in three or more layers.

In FIG. 1, the number of layers of the variable resistors R may correspond to the number of the common bit planes CPn and CPn+1.

The variable resistors R may locally or wholly store a resistance difference thereof. For example, the variable resistors R may each have at least two resistance states according to an applied voltage. These variable resistance states of the variable resistors R may also be maintained when the voltage is removed. Accordingly, the variable resistors R may have data storing capability.

For example, the variable resistors R may include anti-fuse materials. The resistance state of the variable resistors R may change with or without a phase change. When the resistance state of the variable resistors R changes with the phase change, the variable resistors R may be referred to as phase change resistors that may have a high resistance state or a low resistance state. For example, the variable resistors R may include at least one material selected from the group consisting of GST (GeSbxTey), $TiO_2$, HfO, ZrO, ZnO, $WO_3$, CoO, $Nb_2O_5$, NiO, TiNiO, LiNiO, AlO, InZnO, VO, SrZrO, SrTiO, CrO, FeO, CuO, TaO, PCMO ($Pr_{1-x}Ca_xMnO_3$), SiN, and AlN.

In another example, the variable resistors R may each include a fuse material such as an insulation breaking material. For example, the variable resistors R may each include an insulating material, such as SiO2, Al2O3 or SiN, with the insulation material being breakable according to an applied voltage. Since this kind of insulation breaking material cannot be reversed once broken, the non-volatile memory device may be used as a one-time program (OTP) memory that may be used in products that require high memory capacity, despite its one-time usage.

Figure 8:
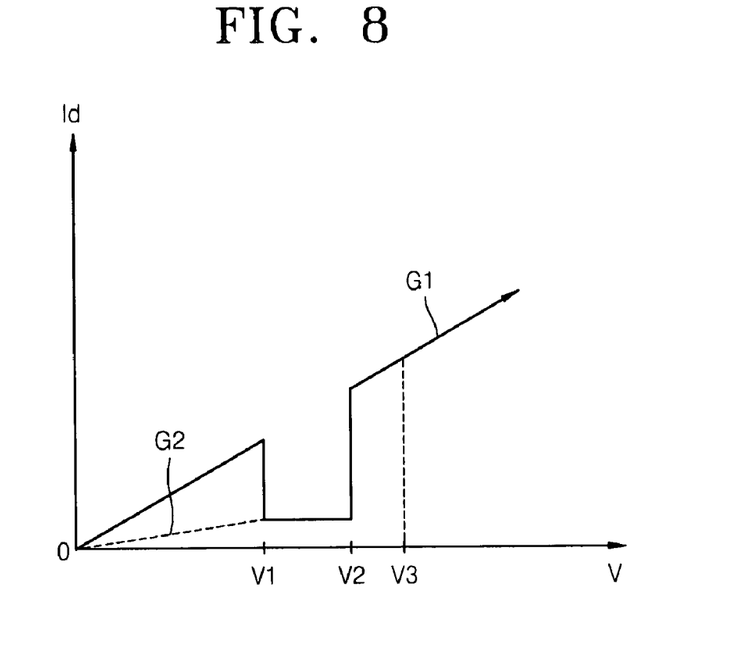
FIGS. 8 and 9 are graphs showing voltage-current characteristics according to a type of the variable resistors.
Figure 9:
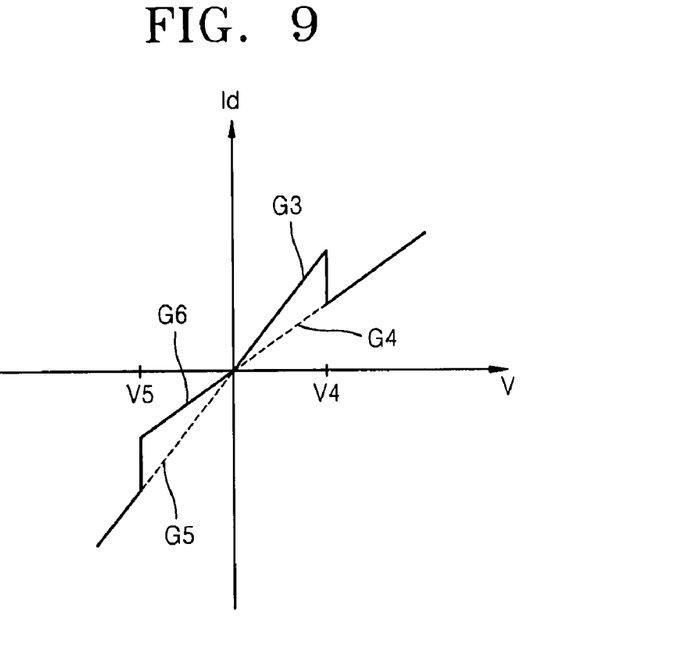

FIGS. 8 and 9 are graphs showing voltage-current characteristics according to a type of the variable resistors R. In FIGS. 8 and 9, the x-axis represents an applied voltage (V) and the y-axis represents a current Id. For example, FIG. 8 illustrates a case where the variable resistors R include NiO, and FIG. 9 illustrates a case where the variable resistors R include $TiO_2$.

Referring to FIG. 8, G1 denotes voltage-current characteristics when the variable resistors R have low resistance, and G2 denotes voltage-current characteristics when the variable resistors R have high resistance.

In FIG. 8, when a voltage applied to the variable resistors R is a first voltage V1 (V1>0), the resistance of the variable resistors R is abruptly increased and the current Id is abruptly decreased. This high resistance state of the variable resistors R may be maintained until an applied voltage reaches a second voltage V2. When a voltage applied to the variable resistors R is subsequently greater than the second voltage V2, the resistance of the variable resistors R is suddenly decreased and the current Id is abruptly increased. Thus, the resistance of the variable resistors R becomes low again at the voltage greater than the second voltage V2.

The variation of the resistance of the variable resistors R may be maintained constant when a voltage applied to the variable resistors R is smaller than the first voltage V1. For example, when the variable resistors R are set with high resistance by applying a voltage that is greater than or equal to the first voltage V1 and less than or equal to the second voltage V2 ($V1 \leq V \leq V2$) to the variable resistors R, and then a voltage smaller than the first voltage V1 is applied to the variable resistors R, the current may vary according to G2.

On the other hand, when the variable resistors R are set with low resistance by applying a voltage greater than the second voltage V2, for example, a third voltage V3, and then a voltage smaller than the first voltage V1 is applied to the variable resistors R, a current may vary according to G1.

Accordingly, when a voltage smaller than the first voltage V1 is applied to the variable resistors R, the resistance state of the variable resistors R may be read without changing the resistance state thereof. The high resistance state and the low resistance state of the variable resistors R may respectively refer to data "0" and "1", and accordingly, the variable resistors R may be used for data storage.

Referring to FIG. 9, G3 and G5 denote voltage-current characteristics when the variable resistors R have low resistance, and G4 and G6 denote voltage-current characteristics when the variable resistors R have high resistance.

When a voltage applied to the variable resistors R is greater than the fourth voltage V4 (V4>0), the variable resistors R are changed to a high resistance state and the current Id is abruptly decreased. Meanwhile, when a voltage applied to the variable resistors R is less than the fifth voltage V5 (V5<0), the variable resistors R are changed to a low resistance state and the Id current is abruptly increased.

Accordingly, when a voltage greater than the fourth voltage V4 is applied to the variable resistors R to change the variable resistors R to a high resistance state and then a voltage that is greater than or equal to the fifth voltage V5 and smaller than or equal to the fourth voltage V4 ($V5 \leq V \leq V4$) is applied to the variable resistors R, a current flowing through the variable resistors R varies according to G4 or G6.

Meanwhile, when the variable resistors R are set with low resistance by applying a voltage smaller than the fifth voltage V5, and then a voltage that is greater than or equal to the fifth voltage V5 and smaller than or equal to the fourth voltage V4 ($V5 \leq V \leq V4$) is applied to the variable resistors R, a current flowing through the variable resistors R varies according to G3 or G5.

The high resistance state and the low resistance state of the variable resistors R may respectively refer to data "0" and "1", and accordingly, the variable resistors R may be used for data storage.

Referring to FIG. 1 again, the variable resistors R may each have a first terminal a1 and a second terminal a2, and may be arranged in a matrix form in each of the layers. The arrangement of the variable resistors R of each layer may be substantially the same, but example embodiments are not limited thereto. In example embodiments, the first terminals a1 of the variable resistors R of each layer may be coupled to their corresponding common bit planes from among the first through (n+1)th common bit planes CP1 through CPn+1. For example, the variable resistors R of an n-th layer may be coupled to the common bit plane CPn of the n-th layer, and the variable resistors R of a (n+1)-th layer may be coupled to the common bit plane CPn+1 of the (n+1)-th layer.

Switching devices S may be coupled between the first terminals a1 of the variable resistors R and the common bit planes CPn and CPn+1, respectively. The switching devices S may rectify or control the current flow between the variable resistors R and the common bit planes CPn and CPn+1, respectively.

For example, each of the switching devices S may include a diode or a threshold voltage element. Examples of the diode include a PN diode, a back-to-back PN diode, a Schottky diode, a back-to-back Schottky diode, a tunnel diode, a varactor diode, and a Zener diode. Examples of the threshold voltage element include a metal-insulator transition (MIT) device.

According to example embodiments, memory cells may include each a variable resistor R and a switching device S. The memory cells may be arranged in a matrix form in each layer, and also as a plurality of layers. Accordingly, the non-volatile memory device according to example embodiments may be highly integrated by increasing the number of memory cells stacked.

Bit lines BL1 and BL2 may be coupled to second terminals a2 of the variable resistors R. A plurality of cell selection transistors TSC may be coupled between the bit lines BL1 and BL2 and the second terminals a2 of the variable resistors R. A plurality of sense amplifiers S/A and decoder lines DL1 and DL2 may be further coupled to the bit lines BL1 and BL2, respectively.

The number of cell selection transistors TSC, the bit lines BL1 and BL2, and the decoder lines DL1 and DL2 may be appropriately selected according to the number and arrangement of the variable resistors R, and example embodiments are not limited to the configuration thereto illustrated in FIG. 1.

Word lines WL1 and WL2 may be coupled to the cell selection transistors TSC so as to switch on or off the cell selection transistors TSC, respectively. For example, the word lines WL1 and WL2 may be respectively coupled to gates of the cell selection transistors TSC. The number of word lines WL1 and WL2 may be appropriately selected according to the arrangement of the variable resistors R and do not limit the range of example embodiments.

The bit lines BL1 and BL2 and the word lines WL1 and WL2 may be arranged to cross one another so as to selectively access the variable resistors R. For example, the bit lines BL1 and BL2 may be arranged in different columns and the word lines WL1 and WL2 may be arranged in different rows.

Each cell selection transistor TSC may be commonly coupled to the corresponding variable resistors R of different layers on the cell selection transistor TSC. For example, when the variable resistors R of each layer are arranged in a 2×2 matrix, the cell selection transistors TSC may be arranged in a 2×2 matrix. The bit lines BL1 and BL2 may be respectively coupled to the cell selection transistors TSC arranged in corresponding lines, and accordingly, to the variable resistors R arranged in the corresponding lines. The word lines WL1 and WL2 may be respectively coupled to the cell selection transistors TSC arranged in corresponding lines.

The above-described arrangement of the bit lines BL1 and BL2 and the word lines WL1 and WL2 commonly coupled to cell selection transistors TSC is relatively simple. Thus, the bit lines BL1 and BL2 and the word lines WL1 and WL2 do not have to be arranged in multiple layers in accordance with the variable resistors R of each layer.

Also, according to example embodiments, the common bit planes CPn and CPn+1 may reduce the wiring resistance between the layer selection lines LSLn and LSLn+1 and the variable resistors R. Since the common bit planes CPn and CPn+1 are formed as conductor planes, a voltage decrease may be lessened or minimized irrespective of the distance between the layer selection lines LSLn and LSLn+1 and the variable resistors R. Accordingly, a non-volatile memory device according to example embodiments may have a relatively high speed.

Figure 2:
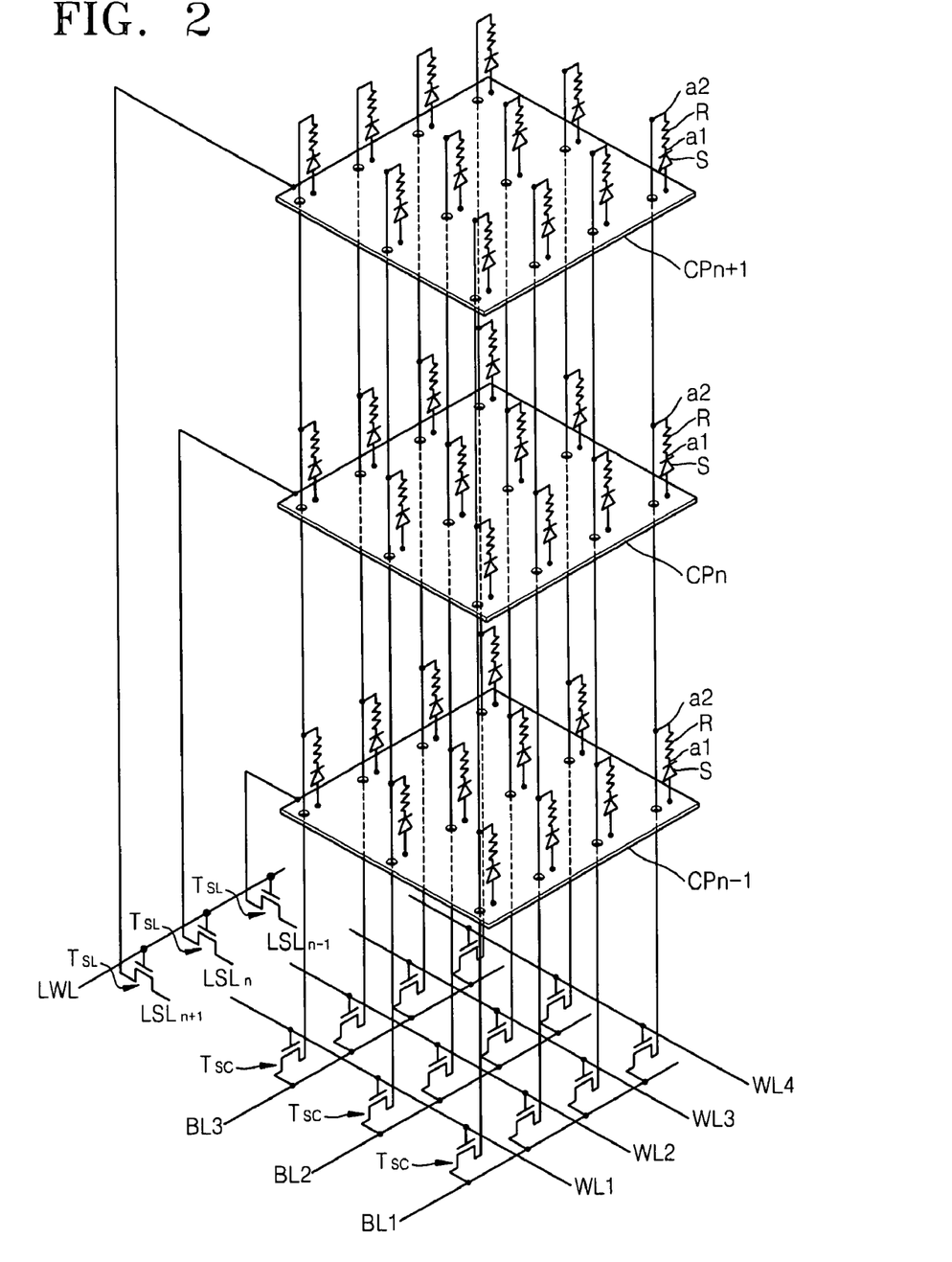
FIG. 2 is another circuit diagram illustrating a non-volatile memory device according to example embodiments.

FIG. 2 is another circuit diagram illustrating a non-volatile memory device according to example embodiments. The structure of the non-volatile memory device of FIG. 2 includes some elements which have been modified compared to those of the non-volatile memory device of FIG. 1. Thus, descriptions about elements common to both non-volatile memory devices of FIGS. 1 and 2 will not be repeated.

Referring to FIG. 2, common bit planes CPn−1, CPn, and CPn+1 may be provided in a stack. For example, the common bit planes CPn−1, CPn, and CPn+1 may denote the arrangement of (n−1)-th, n-th, and (n+1)-th layers, respectively. Variable resistors R of each layer may be coupled to their corresponding common bit plane among the common bit planes CPn−1, CPn, and CPn+1. The number of common bit planes CPn−1, CPn, and CPn+1 and variable resistors R may be appropriately selected according to the capacity of the non-volatile memory device.

Bit lines BL1, BL2, and BL3 and word lines WL1, WL2, WL3, and WL4 may be arranged to cross one another so as to selectively access the variable resistors R. For example, in contrast to the non-volatile memory device described with reference to FIG. 1, the bit lines BL1, BL2, and BL3 may be arranged in different rows, and the word lines WL1, WL2, WL3, and WL4 may be arranged in different columns. The number of bit lines BL1, BL2, and BL3 and word lines WL1, WL2, WL3, and WL4 may be appropriately selected according to the arrangement of the variable resistors R.

Cell selection transistors TSC may be coupled between the bit lines BL1, BL2, and BL3 and the variable resistors R. For example, each of the cell selection transistors TSC may be commonly coupled to variable resistors R of different layers on the cell selection transistor TSC. For example, the variable resistors R in each layer may be arranged in a 4×4 matrix, and the cell selection transistors TSC may be arranged in a 4×4 matrix. According to another embodiment, the variable resistors R may be arranged in an i×j matrix, where i and j are natural numbers.

The bit lines BL1, BL2, and BL3 may be respectively coupled to the cell selection transistors TSC arranged in corresponding rows, and to the variable resistors R arranged in the corresponding rows. The word lines WL1, WL2, WL3, and WL4 may be respectively coupled to the cell selection transistors TSC arranged in corresponding lines.

Layer selection lines LSLn−1, LSLn, and LSLn+1 may be respectively coupled to the common bit planes CPn−1, CPn, and CPn+1. Layer selection transistors TSL may be coupled between the layer selection lines LSLn−1, LSLn, and LSLn+1 and the common bit planes CPn−1, CPn, and CPn+1, respectively. A layer selection word line LWL may be commonly coupled to the layer selection transistors TSL so as to switch on or off the layer selection transistors TSL.

In example embodiments, the arrangement of the cell selection transistors TSC, the bit lines BL1, BL2, and BL3, and the word lines WL1, WL2, WL3, and WL4 may be changed according to the arrangement of the variable resistors R of each layer.

Figure 3:
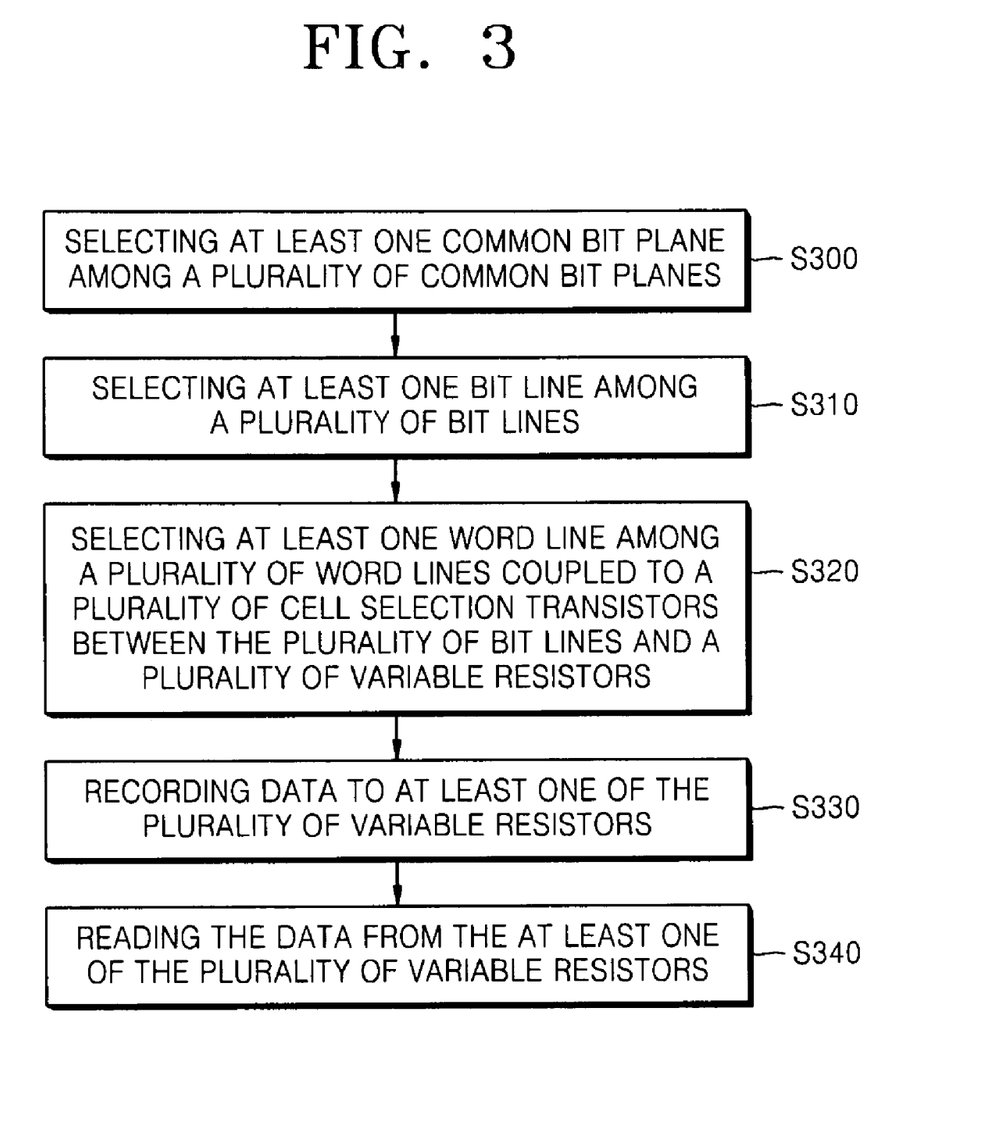
FIG. 3 is a flow diagram illustrating a method of operating the non-volatile memory devices of FIGS. 1 and 2 according to example embodiments.

FIG. 3 is a flow diagram illustrating a method of operating the non-volatile memory devices of FIGS. 1 and 2 according to example embodiments.

For example, at S300, at least one common bit plane among a plurality of common bit planes CP0 through CPn+1 may be selected. At S310, at least one bit line among a plurality of bit lines BL1-BL3 may be selected. At S320, at least one word line among a plurality of word lines WL1-WL4 coupled to a plurality of cell selection transistors TSC between the plurality of bit lines BL1-BL3 and a plurality of variable resistors R may be selected. Steps S300 through S320 may be performed in any order and/or simultaneously.

At S330, data may be recorded to at least one of the variable resistors R selected from among the plurality of variable resistors R. At S340, the data recorded in the at least one variable resistors R selected from among the plurality of variable resistors R may be read. Steps S330 through S340 may be performed independently of one another.

Referring to FIGS. 1 and 3, one of the variable resistors R may be randomly accessed. For example, by selecting the layer selection line LSLn, the bit line BL2, and the word line WL1, a selected memory cell C1 can be accessed. By this random access, the variable resistors R in the memory cell C1 can be selectively accessed.

In order to record data to the variable resistor R in the memory cell C1 or read the recorded data from the variable resistor R in the memory cell C1, corresponding operational voltages may be applied to the layer selection line LSLn, the bit line BL2, and the word line WL1 after or at the same time that the selection operation is performed.

The method of recording data or reading the recorded data by random access to the variable resistor R of the memory cell C1 may also substantially be applied to other memory cells (not shown). For example, by selecting at least one of the layer selection line LSLn and LSLn+1, at least one of the bit lines BL1 and BL2, and at least one of the word lines WL1+ WL2, data may be recorded to at least one of the variable resistors R in at least one memory cell or the recorded data may be read from the at least one of the variable resistors R.

Referring to FIGS. 2 and 3, one of the variable resistors R may be randomly accessed. For example, by selecting the layer selection line LSLn, the bit line BL2, and the word line WL2, a selected memory cell C2 can be accessed. By this random access, the variable resistor R in the memory cell C2 can be selectively accessed.

In order to record data to the variable resistor R in the memory cell C2 or read the recorded data from the memory cell C2, corresponding operational voltages may be applied to the layer selection line LSLn, the bit line BL2, and the word line WL2 after or at the same time that the selection operation is performed.

The method of recording data or reading the recorded data by random access to the variable resistor R of the memory cell C2 may also substantially be applied to other memory cells (not shown). For example, by selecting at least one of the layer selection line LSLn and LSLn+1, at least one of the bit lines BL1, BL2, and BL3, and at least one of the word lines WL1, WL2, WL3, and WL4, data may be recorded to at least one of the variable resistors R in at least one memory cell or the recorded data may be read from the at least one of the variable resistors R.

Figure 4:
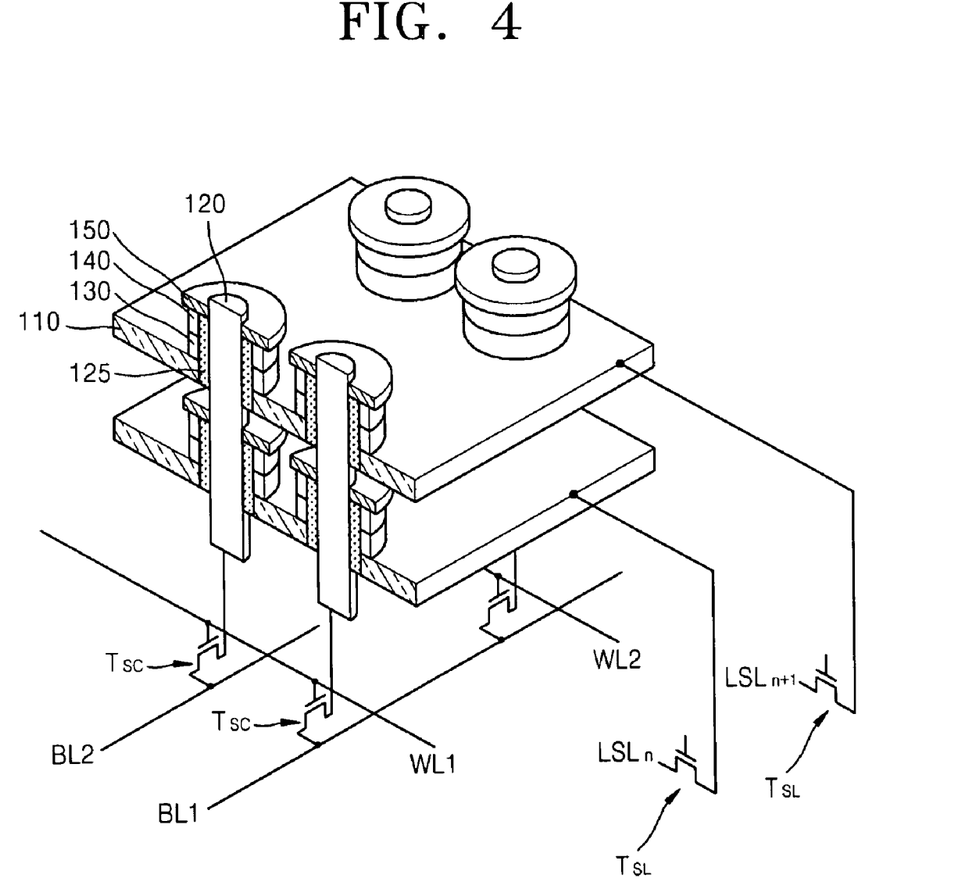
FIG. 4 is a perspective view illustrating a non-volatile memory device according to example embodiments.

FIG. 4 is a perspective view illustrating a non-volatile memory device according to example embodiments. The structure of the non-volatile memory device of FIG. 4 also illustrates the memory cells of the non-volatile memory devices of FIG. 1 or 2. Thus, description about common elements between the non-volatile memory devices of FIGS. 1 and 4 or FIGS. 2 and 4 will not be repeated.

Referring to FIG. 4, common bit planes 110 may be stacked on one another. The common bit planes 110 may correspond to the common bit planes CPn−1, CPn, and CPn+1 of FIG. 1 or FIG. 2. For example, the common bit planes 110 may be provided as planar conductors. The common bit planes 110 may be referred to as bottom electrodes according to the position thereof.

Layer selection lines LSLn and LSLn+1 may be coupled to the common bit planes 110 while having layer selection transistors TSL interposed therebetween, respectively. For example, the layer selection transistors TSL may be metal-oxide-semiconductor field-effect transistors (MOSFET) on a substrate (not shown), and the layer selection lines LSLn and LSLn+1 may be conductive lines on the substrate.

Through electrodes 120 may extend through the common bit planes 110. The through electrodes 120 may not directly contact the common bit planes 110. For example, a spacer insulating layer 125 may be interposed between a sidewall of each of the through electrodes 120 and a sidewall of each of the common bit planes 110. Alternatively, the sidewalls of the through electrodes 120 may be arranged a predetermined distance apart from the sidewalls of the common bit planes 110 by an empty space.

The through electrodes 120 may be connected to the bit lines BL1 and BL2 via the cell selection transistors TSC, respectively. The word lines WL1 and WL2 may be coupled to the cell selection transistors TSC. For example, the cell selection transistors TSC may be MOSFETs formed on a substrate. The bit lines BL1 and BL2 and the word lines WL1 and WL2 may be conductive lines on the substrate.

Switching devices 130 may be formed on each of the common bit planes 110. The switching devices 130 may respectively correspond to the switching devices S of FIGS. 1 and 2. For example, the switching devices 130 may be formed surrounding the through electrodes 120, respectively, and contacting the common bit planes 110. The spacer insulating layers 125 may be interposed between the through electrodes 120 and the switching devices 130.

The variable resistors 140 may be coupled to the common bit planes 110 with the switching devices 130 interposed between the variable resistors 140 and the common bit planes 110. For example, the variable resistors 140 may be arranged to respectively surround the through electrodes 120 on the switching devices 130. Spacer insulating layers 125 may be interposed between the through electrodes 120 and the variable resistors 140.

Top electrodes 150 may be formed to couple to the through electrodes 120, respectively. For example, the top electrodes 150 may be disposed to correspondingly contact the sidewalls of the through electrodes 120 on the variable resistors 140 opposite to the common bit planes 110. Accordingly, signals of the bit lines BL1 and BL2 can be transmitted to the variable resistors 140 via the through electrodes 120 and the top electrodes 150.

According to example embodiments, the variable resistors 140 and the bit lines BL1 and BL2 may be coupled to each other through the through electrodes 120 and thus without using an additional contact structure. Also, the variable resistors 140 of each layer may be accessed through their common bit planes 110. Accordingly, the variable resistors 140 of each layer may share the cell selection transistors TSC, the bit lines BL1 and BL2, and the word lines WL1 and WL2. Thus, no complicated contact structures need to be formed in the variable resistors 140 of each layer.

Figure 5:
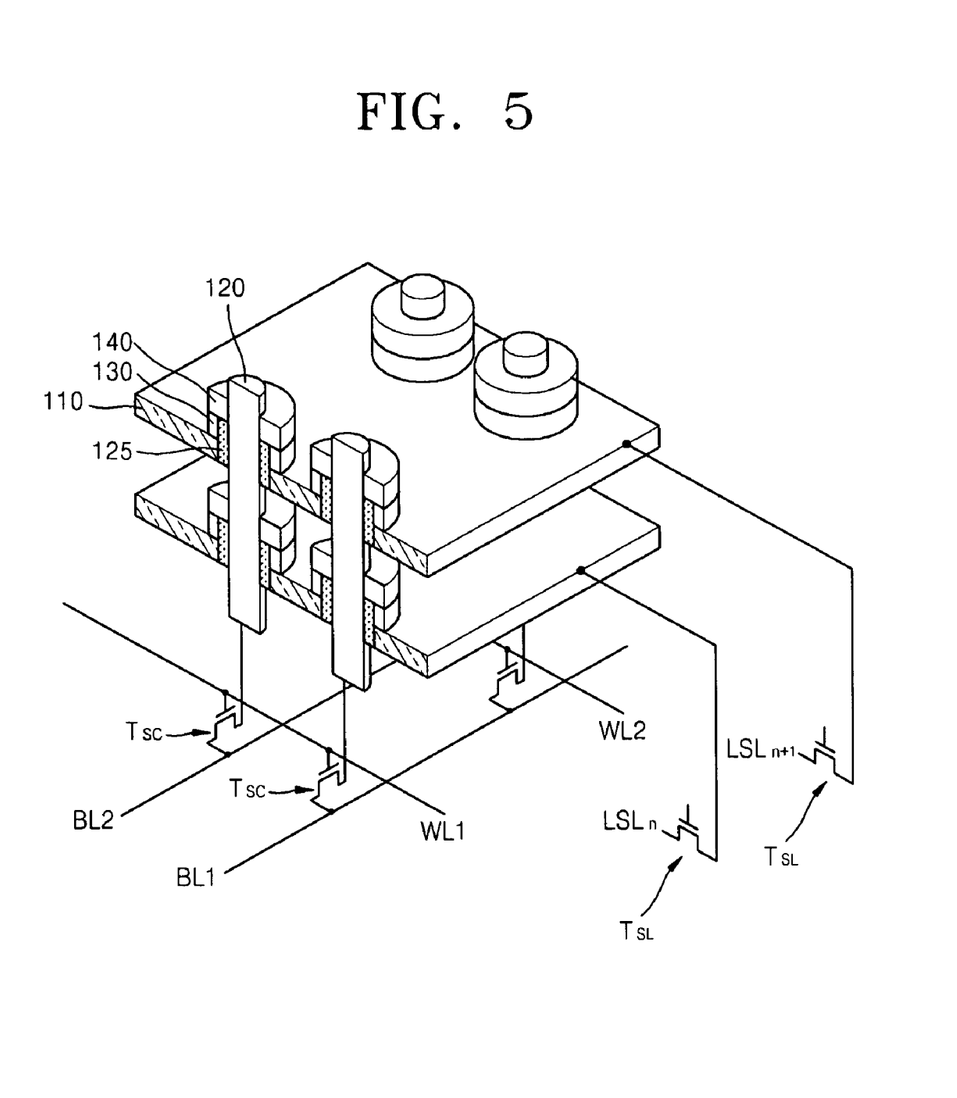
FIG. 5 is another perspective view illustrating a non-volatile memory device according to example embodiments.

FIG. 5 is another perspective view illustrating a non-volatile memory device according to example embodiments. The non-volatile memory device of FIG. 5 includes some components which have been modified compared to those of the non-volatile memory device of FIG. 4. Thus, descriptions about elements common to both of the non-volatile memory devices of FIGS. 4 and 5 will not be repeated.

Referring to FIG. 5, the variable resistors 140 may respectively contact the through electrodes 120 without interposing the top electrodes 150 of FIG. 4. Accordingly, the spacer insulating layers 125 may be interposed between the sidewalls of the through electrodes 120 and the common bit planes 110 and between the sidewalls of the through electrodes 120 and the switching devices 130, and not between the sidewalls of the through electrodes 120 and the variable resistors 140.

Figure 6:
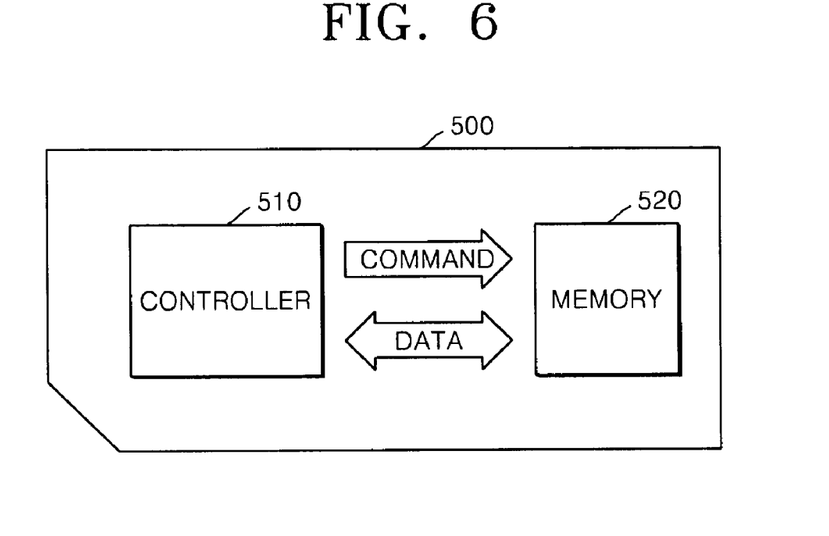
FIG. 6 is a block diagram illustrating a memory card according to example embodiments.

FIG. 6 is a block diagram illustrating a memory card according to example embodiments.

Referring to FIG. 6, a controller 510 and a memory 520 may exchange electric signals. For example, according to a command of the controller 510, the memory 520 and the controller 510 may transmit/receive data to/from each other. Accordingly, the memory card 500 may store data to the memory 520 or output the data from the memory 520 to the outside. The memory 520 may have the same arrangement or structure as one of the non-volatile memory devices described with reference to FIGS. 1 through 5

The memory card 500 may be used as a data storage medium of various mobile devices. For example, the memory card 500 may include a multi media card (MMC) or a secure digital card (SD).

Figure 7:
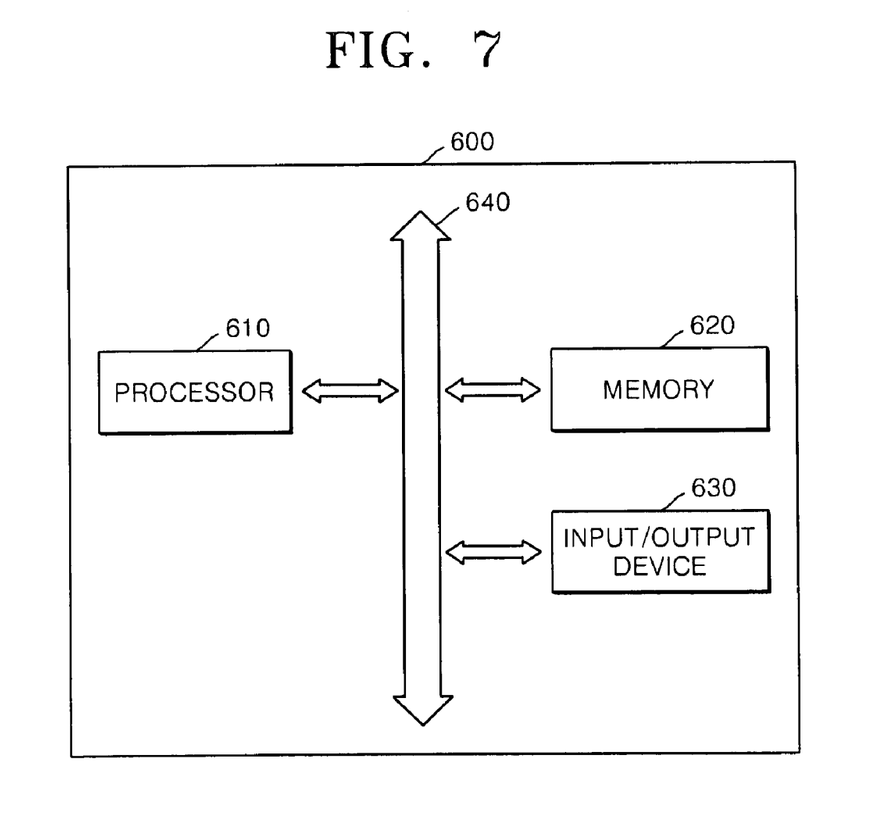
FIG. 7 is a block diagram illustrating an electronic system according to example embodiments.

FIG. 7 is a block diagram illustrating an electronic system according to example embodiments.

Referring to FIG. 7, a processor 610, an input/output device 630, and a memory 620 may transmit or receive data to and from one another via a bus 640. The processor 610 may execute a program and control the electronic system 600. The input/output device 630 may be used in inputting or outputting data of the electronic system 600. The electronic system 600 may be connected to an external device such as a personal computer or a network and may exchange data with the external device via the input/output device 630.

The memory 620 may store code for operations of the processor 610 and data. For example, the memory 620 may have the same arrangement or structure as one of the non-volatile memory devices described with reference to FIGS. 1 through 5.

For example, the electronic system 600 may be used in various electronic control devices which require the memory 620, and be used in mobile phones, MP3 players, navigation devices, solid state disks (SSD), or household appliances.

It should be understood that example embodiments described therein should be considered in a descriptive sense only and not for purposes of limitation. Although the example embodiments have been disclosed for illustrative purposes, those skilled in the art will appreciate that various modifications, additions and substitutions are possible, without departing from the scope and spirit of example embodiments as disclosed in the accompanying claims.

What is claimed is:

1. A non-volatile memory device comprising:
    a plurality of variable resistors, each of the variable resistors having first and second terminals, the plurality of variable resistors arranged as a first layer of a plurality of layers and having data storage capability, the plurality of variable resistors disposed to surround sidewalls of a plurality of through electrodes, and sidewalls of the plurality of variable resistors contact the sidewalls of the plurality of the through electrodes;
    at least one common bit plane arranged as a second layer of the plurality of layers and coupled to the first terminal of each of the variable resistors of the first layer; and
    a plurality of bit lines coupled to the second terminal of each of the variable resistors of the first layer.

2. The non-volatile memory device of claim 1, further comprising:
    a plurality of cell selection transistors coupled between the plurality of bit lines and the plurality of variable resistors.

3. The non-volatile memory device of claim 2, further comprising:
    a plurality of word lines coupled to the plurality of cell selection transistors to switch the plurality of cell selection transistors between one of an, on and off state.

4. The non-volatile memory device of claim 3, wherein the plurality of variable resistors are arranged in a matrix form in the first layer, and the plurality of bit lines extend across the plurality of word lines to selectively access the plurality of variable resistors in the first layer.

5. The non-volatile memory device of claim 1, further comprising:
    a plurality of switching devices coupled between the plurality of variable resistors and the at least one common bit plane.

6. The non-volatile memory device of claim 5, wherein each of the plurality of switching devices includes a diode.

7. The non-volatile memory device of claim 1, further comprising:
    at least one layer selection line coupled to the at least one common bit plane.

8. The non-volatile memory device of claim 7, further comprising:
    at least one layer selection transistor coupled between the at least one common bit plane and the at least one layer selection line.

9. The non-volatile memory device of claim 8, further comprising:
    a layer selection word line coupled to the at least one layer selection transistor to switch the at least one layer selection transistor between one of an on and off state.

10. The non-volatile memory device of claim 1, further comprising:
    at least one decoder line coupled to at least one of the bit lines.

11. The non-volatile memory device of claim 1, wherein the plurality of variable resistors are arranged in more than one of the plurality of layers, and the at least one common bit plane are arranged in more than one of the plurality of layers as a stacked plurality of common bit planes.

12. The non-volatile memory device of claim 11, wherein the second terminals of at least one of the plurality of variable resistors in each of the plurality of layers are commonly coupled to each other.

13. A method of operating the non-volatile memory device, comprising:
    selecting at least one common bit plane among a plurality of common bit planes;
    selecting at least one bit line among a plurality of bit lines; and
    selecting at least one word line among a plurality of word lines coupled to a plurality of cell selection transistors between the plurality of bit lines and a plurality of variable resistors, the plurality of variable resistors disposed to surround sidewalls of a plurality of through electrodes, and sidewalls of the plurality of variable resistors contact the sidewalls of the plurality of the through electrodes.

14. The method of claim 13, further comprising:
    recording data to at least one of the plurality of variable resistors.

15. The method of claim 13, further comprising:
    reading the data from the at least one of the plurality of variable resistors.

16. A non-volatile memory device comprising:
    at least one common bit plane arranged as one of a plurality of layers;
    a plurality of variable resistors coupled to the at least one common bit plane as at least another of the plurality of layers and having data storage capability, the plurality of variable resistors disposed to surround sidewalls of a plurality of through electrodes, and sidewalls of the plurality of variable resistors contact the sidewalls of the plurality of the through electrodes;
    a plurality of through electrodes extending through the at least one common bit plane and coupled to at least one of the plurality of variable resistors; and a plurality of bit lines coupled to the plurality of through electrodes, wherein the plurality of variable resistors are disposed to surround sidewalls of the plurality of through electrodes, and sidewalls of the plurality of variable resistors contact the sidewalls of the plurality of the through electrodes.

17. The non-volatile memory device of claim 16, further comprising:
a plurality of switching devices interposed between the plurality of variable resistors and the at least one common bit plane.

18. The non-volatile memory device of claim 16, further comprising:
a plurality of top electrodes on the plurality of variable resistors opposite to the at least one common bit plane, wherein the plurality of top electrodes contact the plurality of through electrodes.

19. The non-volatile memory device of claim 16, further comprising:
a spacer insulating layer interposed between the at least one common bit plane and the sidewalls of the plurality of through electrodes.

20. A non-volatile memory device comprising:
a plurality of first variable resistors, each of the first variable resistors having first and second terminals, the plurality of first variable resistors arranged as a first matrix and the plurality of first variable resistors disposed to surround sidewalls of a plurality of through electrodes, and sidewalls of the plurality of first variable resistors contact the sidewalls of the plurality of the through electrodes;

a plurality of second variable resistors, each of the second variable resistors having first and second terminals, the plurality of second variable resistors arranged as a second matrix and the plurality of second variable resistors disposed to surround sidewalls of a plurality of through electrodes, and sidewalls of the plurality of second variable resistors contact the sidewalls of the plurality of the through electrodes;

a first common bit plane coupled to the first terminal of each of the first variable resistors arranged as the first matrix;

a second common bit plane coupled to the first terminal of each of the second variable resistors arranged as the second matrix; and a plurality of bit lines coupled to the second terminal of each of the first and second variable resistors.

* * * * *